(12) United States Patent
Lin et al.

(10) Patent No.: US 9,590,036 B2
(45) Date of Patent: Mar. 7, 2017

(54) CONTACT WINDOW STRUCTURE, PIXEL STRUCTURE AND METHOD FOR MANUFACTURING THEREOF

(71) Applicant: E Ink Holdings Inc., Hsinchu (TW)

(72) Inventors: Kuan-Yi Lin, Hsinchu (TW); Fang-An Shu, Hsinchu (TW); Tzung-Wei Yu, Hsinchu (TW); Chi-Liang Wu, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/659,632

(22) Filed: Mar. 17, 2015

(65) Prior Publication Data

US 2015/0270164 A1 Sep. 24, 2015

(30) Foreign Application Priority Data

Mar. 24, 2014 (TW) .............................. 103110897 A

(51) Int. Cl.
*H01L 29/06* (2006.01)
*H01L 23/522* (2006.01)
*H01L 21/768* (2006.01)
*H01L 27/12* (2006.01)

(52) U.S. Cl.
CPC .... *H01L 29/0657* (2013.01); *H01L 21/76802* (2013.01); *H01L 23/5226* (2013.01); *H01L 27/124* (2013.01); *H01L 2924/0002* (2013.01)

(58) Field of Classification Search
None
See application file for complete search history.

(56) References Cited

U.S. PATENT DOCUMENTS

| 2001/0000115 A1* | 4/2001 | Greco | ............... | H01L 21/31116 257/773 |
| 2013/0161605 A1* | 6/2013 | Sasagawa | ......... | H01L 29/66477 257/43 |

FOREIGN PATENT DOCUMENTS

TW 200721375 6/2007

OTHER PUBLICATIONS

Corresponding Taiwanese Office Action that this art reference was cited on May 20, 2016.

* cited by examiner

*Primary Examiner* — Angel Roman
*Assistant Examiner* — Kevin Quinto
(74) *Attorney, Agent, or Firm* — CKC & Partners Co., Ltd.

(57) ABSTRACT

The present disclosure provides a contact window structure. In the contact window structure, a first insulating layer, having a first opening, is positioned on a first metal layer, wherein the first opening exposes a part of the first metal layer. A second metal layer covers the first opening and contacts with the first metal layer via the first opening. A second insulating layer, having a second opening, is positioned on the first insulating layer, wherein the second opening exposes a part of the second layer and the first insulating layer. The projection area of the second opening on the first metal layer covers the projection area of the first opening on the first metal layer. A pixel structure containing the contact window structure and a manufacturing method thereof are also provided herein.

19 Claims, 9 Drawing Sheets

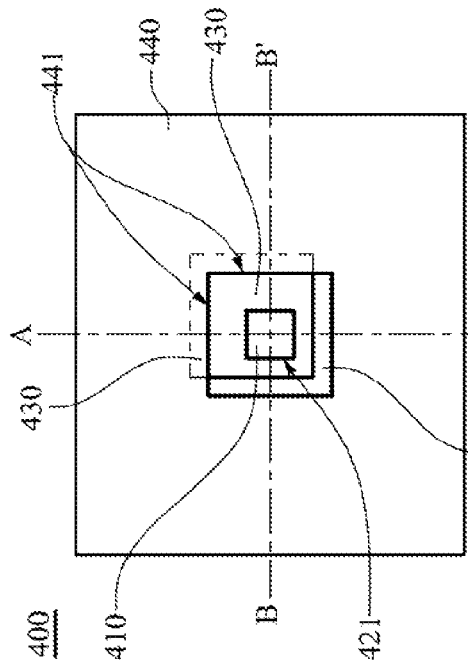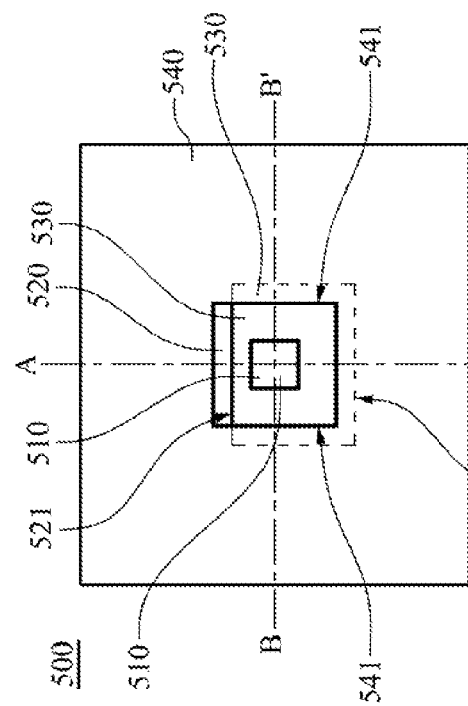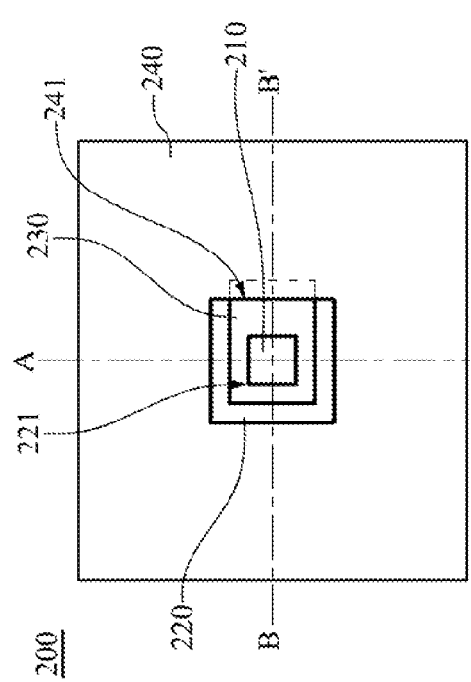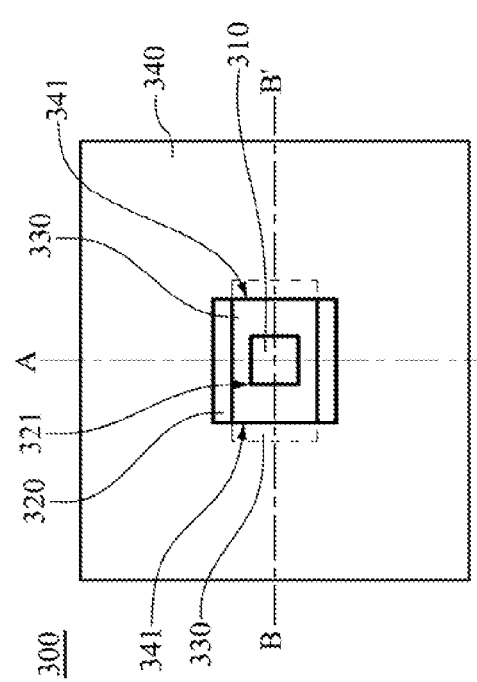

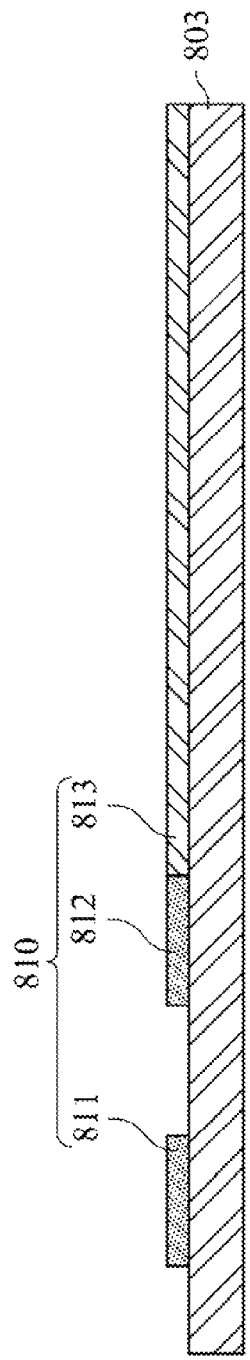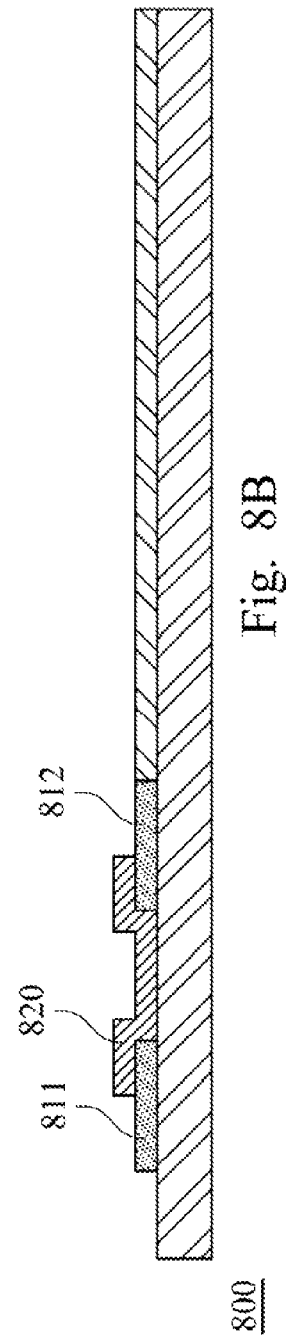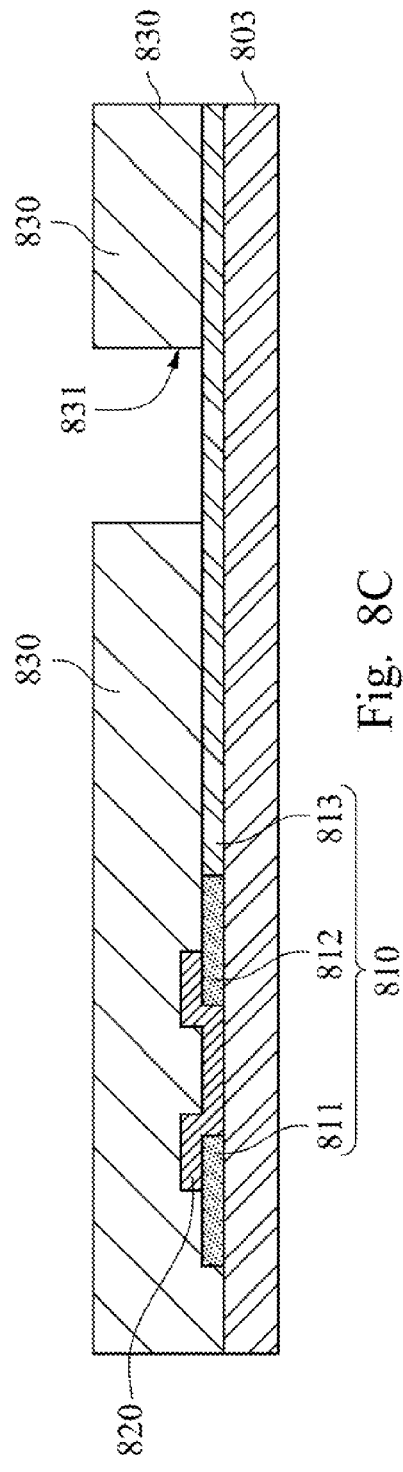

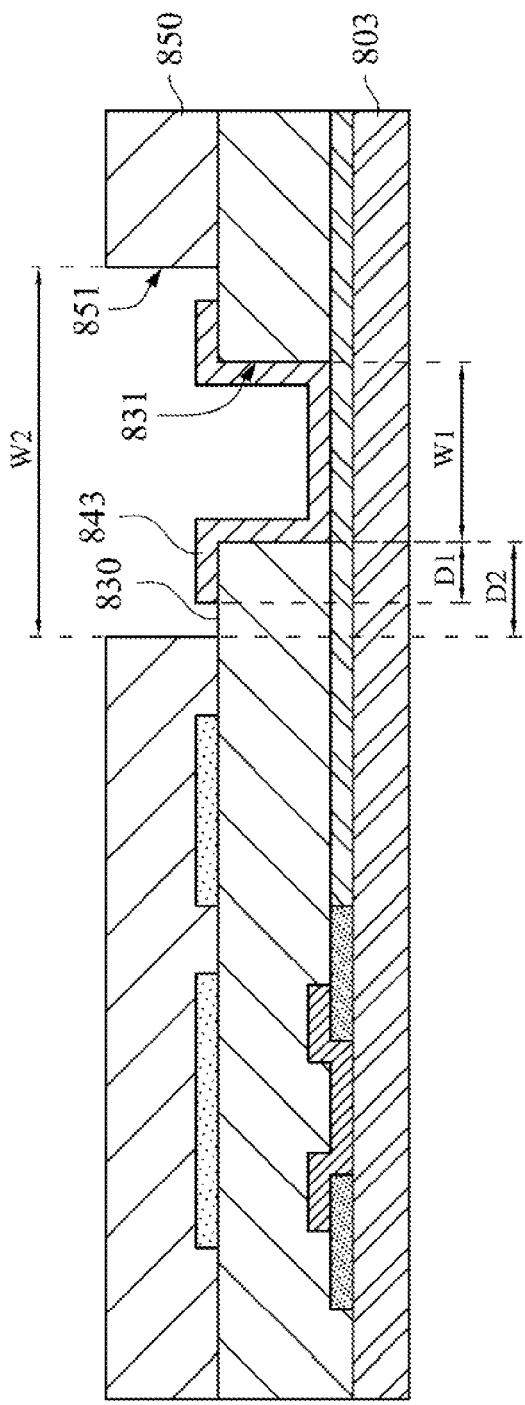
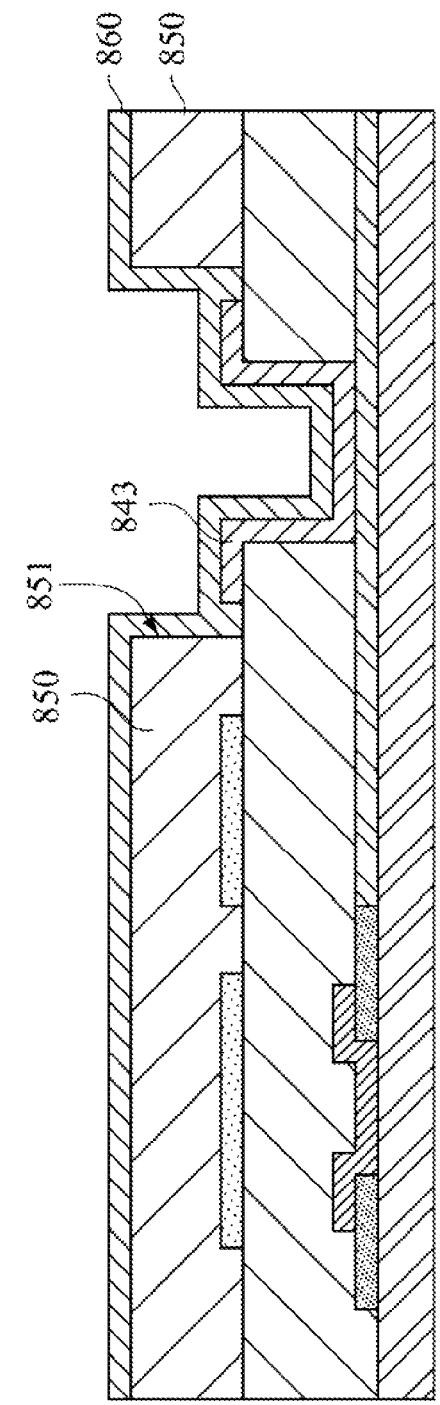
Fig. 8H
Fig. 8I

CONTACT WINDOW STRUCTURE, PIXEL STRUCTURE AND METHOD FOR MANUFACTURING THEREOF

RELATED APPLICATIONS

This application claims priority to Taiwanese Application Serial Number 103110897, filed Mar. 24, 2014, which is herein incorporated by reference.

BACKGROUND

Field of Invention

The present invention relates to a contact window structure. More particularly, the present invention relates to a pixel structure having the contact window structure and a method for manufacturing the contact window structure.

Description of Related Art

In conventional pixel structures of a display device, a contact window is generally used to vertically connect an upper metal with a lower metal. For example, a pixel electrode at an upper layer is electrically connected to a lower source/drain conductive layer via the contact window.

A conventional method for forming the contact window includes forming an insulating layer on a metal layer, and then forming the contact window on the insulating layer by a lithography process, in which the contact window exposes a part of the metal layer. However, when the contact window is formed on the metal layer, since the metal layer may reflect light, a developing resolution may be decreased such that an aperture of an opening is too small or the opening cannot be even formed.

Therefore, a novel contact window structure is needed to solve problems that conventional contact window structures may have.

SUMMARY

The invention provides a contact window structure used to solve lithography problems occurring in conventional contact window structures so as to increase a resolution of a lithography process.

One aspect of the invention is to provide a contact window structure. The contact window structure includes a first metal layer, a first insulating layer, a second metal layer, a second insulating layer and a third metal layer.

The first insulating layer is positioned on the first metal layer, and the first insulating layer has a first opening exposing a part of the first metal layer. The second metal layer covers the first opening, and is in contact with first metal layer via the first opening. The second insulating layer is positioned on the first insulating layer, and the second insulating layer has a second opening exposing the second metal layer and a part of the first insulating layer, in which a projection area of the second opening on the first metal layer covers a projection area of the first opening on the first metal layer. The third metal layer covers the second insulating layer and the second opening, and is in contact with the second metal layer via the second opening.

According to an embodiment of the invention, the first opening has a first width (W1) and the second opening has a second width (W2) along a first direction of the substrate, and the second width (W2) is greater than the first width (W1).

According to an embodiment of the invention, a ratio (W2/W1) of the second width to the first width is greater than 1 and less than or equal to 2.

According to an embodiment of the invention, the first opening has a third width (W3) and the second opening has a fourth width (W4) along a second direction of the substrate, and the fourth width (W4) is greater than the third width (W3).

According to an embodiment of the invention, a ratio (W4/W3) of the fourth width to the third width is greater than 1 and less than or equal to 2.

According to an embodiment of the invention, a first distance (D1) between a side of the second metal layer and an edge of the first opening at the side is not greater than a second distance (D2) between the an edge of the second opening at the side of the second metal layer and the edge of the first opening.

According to an embodiment of the invention, a ratio (D2/D1) of the second distance to the first distance is greater than 1 and less than or equal to 1.5.

According to an embodiment of the invention, any side edge of the second opening is in contact with the second metal layer.

According to an embodiment of the invention, any two side edges of the second opening are in contact with the second metal layer.

According to an embodiment of the invention, the any two side edges of the second opening are two adjacent side edges or two opposite side edges.

According to an embodiment of the invention, any three side edges of the second opening are in contact with the second metal layer.

According to an embodiment of the invention, the contact window structure further includes an upper gate transistor structure electrically connected to the first metal layer.

According to an embodiment of the invention, the contact window structure further includes a lower gate transistor structure electrically connected to the first metal layer.

Another aspect of the invention is to provide a pixel structure. The pixel structure includes a substrate, a first metal layer, a semiconductor layer, a gate insulating layer, a second metal layer, a protection layer and a pixel electrode.

The first metal layer is positioned on the substrate, and the first metal layer includes a source, a drain, and a first electrode. The semiconductor layer is positioned between the source and the drain, and is in contact with the source and the drain. The gate insulating layer covers the semiconductor layer and the first metal layer, and the gate insulating layer has a first contact window exposing a part of the first electrode.

The second metal layer is positioned on the gate insulating layer. The second metal layer includes a gate, a second electrode and a contact pad. The second electrode and the first electrode form a storage capacitor, and the contact pad is in contact with the first electrode.

The protection layer covers the gate insulating layer and the second metal layer. The protection layer has a second contact window exposing the contact pad and a part of the gate insulating layer, in which a projection area of the second contact window on the substrate covers a projection area of the first contact window on the substrate. A pixel electrode covers the protection layer and is formed in the second contact window to contact with the contact pad.

According to an embodiment of the invention, the first contact window has a first width (W1) and the second contact window has a second width (W2) along a first direction of the substrate. The second width is greater than the first width.

According to an embodiment of the invention, a ratio of the second width (W2) to the first width (W1) is greater than 1 and less than or equal to 2.

According to an embodiment of the invention, the first contact window has a third width (W3) and the second contact window has a fourth width (W4) along a second direction of the substrate. The fourth width (W4) is greater than the third width (W3).

According to an embodiment of the invention, a ratio of the fourth width (W4) to the third width (W3) is greater than 1 and less than or equal to 2.

Another aspect of the invention is to provide a method for manufacturing a pixel structure. The method includes following steps. A substrate is provided. A first metal layer is formed on the substrate, in which the first metal layer includes a source, a drain and a first electrode. A semiconductor layer is formed between the source and the drain, and the semiconductor layer is in contact with the source and the drain. A gate insulating layer is formed on the semiconductor layer, the first metal layer and the substrate, in which the gate insulating layer has a first contact window to expose a part of the first electrode. A second metal layer is formed on the gate insulating layer, in which the second metal layer includes a gate, a second electrode and a contact pad. The second electrode and the first electrode form a storage capacitor, and the contact pad is in contact with the first electrode in the first contact window. A protection layer is formed on the second metal layer and the gate insulating layer. A lithography process is performed such that the protection layer forms a second contact window exposing the contact pad and a part of the gate insulating layer, and a projection area of the second contact window on the substrate covers a projection area of the first contact window on the substrate. A pixel electrode is formed to cover the protection layer, and the pixel electrode is formed in the second contact window to contact with the contact pad.

According to an embodiment of the invention, the lithography process includes following steps. A photoresist layer is formed on the protection layer. The first contact window is covered with a mask, in which a projection area of the mask on the gate insulating layer covers a part of the gate insulating layer and a part of the contact pad. The photoresist layer is developed to form a patterned photoresist layer. The protection layer is etched to form the second contact window.

BRIEF DESCRIPTION OF THE DRAWINGS

The invention can be more fully understood by reading the following detailed description of the embodiment, with reference made to the accompanying drawings as follows:

FIG. 2 is a top view illustrating a contact window structure 200 according to an embodiment of the invention;

FIG. 3 is a top view illustrating a contact window structure 300 according to an embodiment of the invention;

FIG. 4 is a top view illustrating a contact window structure 400 according to an embodiment of the invention;

FIG. 5 is a top view illustrating a contact window structure 500 according to an embodiment of the invention;

FIGS. 8A to 8I are cross-sectional views illustrating manufacturing steps of a pixel structure 800 according to an embodiment of the invention.

DETAILED DESCRIPTION

Specific embodiments of the present invention are further described in detail below with reference to the accompanying figures. In the descriptions or the figures, similar or identical parts use identical symbols or numbers. In the figures, shapes or thickness of the embodiments may be expanded for simplicity or marking convenience, and a part of components in the figures is described by words. It should be understood that components that are not shown or described can be any form known by those skilled in the art.

The terminology used herein is for describing particular embodiments but not for limiting the invention. For example, a using of singular forms of "a", "an" and "the" intends to cover plural forms except that it is clearly indicated in the specification. It should be understood that, terms of "comprise" and "include" used in the specification are for indicating particular features, integers, steps, operations, units and/or components, but not limited to add one or more other features, integers, steps, operations, units and/or components. Cross-sectional views are referenced to provide exemplary descriptions (and structure inside) of the embodiments of the invention, in this way, it is expected that shapes may deviate from the descriptions due to changes of manufacturing technology and/or tolerances. Therefore, the embodiments of the invention should not be understood as being limiting into particular shapes, but as that the described shapes include change due to, for example, shape changes of manufacturing. In addition, described areas are essentially exemplary, and the shapes thereof do not intent to describe practical shapes of the areas of a device and not intent to limit the invention.

In conventional lithography processes of forming contact windows, since metal layers may reflect light, a developing resolution may be decreased such that an aperture of an opening is too small or the opening cannot be even formed. Embodiments of the invention provide a contact window structure including a first metal layer, a first insulating layer, a second metal layer, a second insulating layer and a third metal layer. In the embodiments of the invention, the contact window structure can overcome the problems of bad developing resolutions in the lithography process so as to improve the developing resolution, and cause the contact window having an expected aperture.

Figure 1A:
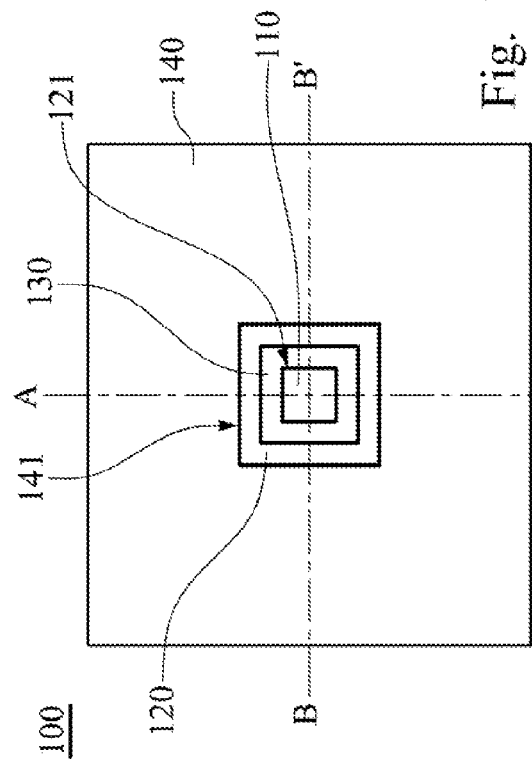
FIG. 1A is a top view illustrating a contact window structure 100 according to an embodiment of the invention.
Figure 1C:
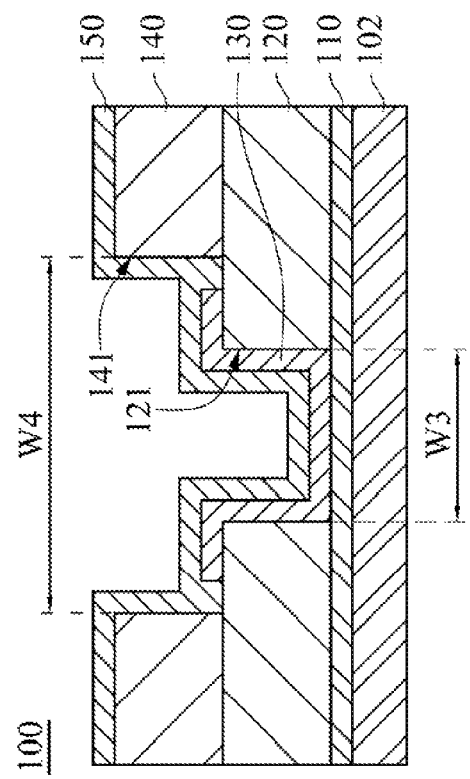
FIGS. 1B and 1C are cross-sectional views illustrating the contact window structure 100 in FIG. 1A.
Figure 1B:
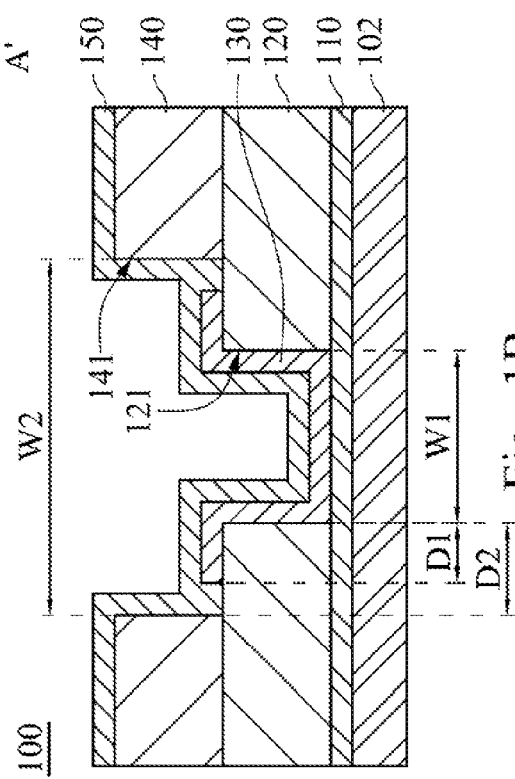

Referring to FIGS. 1A to AC, FIG. 1A is a top view illustrating a contact window structure 100 according to an embodiment of the invention; FIG. 1B is a cross-sectional views of FIG. 1A along a line segment A-A'; and FIG. 1C is a cross-sectional views of FIG. 1A along a line segment B-B'.

The contact window structure 100 includes a first metal layer 110, a first insulating layer 120, a second metal layer 130, a second insulating layer 140 and a third metal layer 150. In FIG. 1A, the contact window structure 100 has a concentric square structure including the first metal layer 110, a first opening 121, the second metal layer 130, a second opening 141, the third metal layer 150 and the second insulating layer 140 from the inside out.

Along the line segment A-A', referring to FIG. 1B, the first metal layer 110 is positioned on the substrate 102, and the first insulating layer 120 is positioned on the first metal layer 110. The first insulating layer 120 has the first opening 121 exposing a part of the first metal layer 110. The second metal layer 130 covers the first opening 121, and is in contact with the first metal layer 110 via the first opening 121. According to an embodiment of the invention, the first opening 121 has a first width (W1) along a first direction (line segment A-A') of the substrate 102.

The second insulating layer 140 is positioned on the first insulating layer 120, and the second insulating layer 140 has the second opening 141 exposing the second metal layer 130 and a part of the first insulating layer 120. A projection area of the second opening 141 on the first metal layer 110 covers a projection area of the first opening 121 on the first metal layer 110 (see FIG. 1A).

According to an embodiment of the invention, the second opening 141 has a second width (W2) along the first direction (line segment A-A') of the substrate 102. According to an embodiment of the invention, the second width (W2) is greater than the first width (W1). According to an embodiment of the invention, a ratio (W2/W1) of the second width to the first width is greater than 1 and less than or equal to 2.

The third metal layer 150 covers the second insulating layer 140 and the second opening 141, and is in contact with the second metal layer 130 via the second opening 141. According to an embodiment of the invention, an upper date transistor structure (not shown) is electrically connected to the first metal layer 110 of the contact window structure 100. According to an embodiment of the invention, a lower gate transistor structure (not shown) is electrically connected to the first metal layer 110 of the contact window structure 100.

In FIG. 1B, there is a first distance (D1) between a side of the second metal layer 130 and an edge of the first opening 121 at the side, and there is a second distance (D2) between the an edge of the second opening 141 and the edge of the first opening 121. The second distance (D2) is greater than the first distance (D1). According to an embodiment of the invention, a ratio (D2/D1) of the second distance to the first distance is approximately greater than 1 and less than or equal to 1.5.

Along the line segment B-B' in FIG. 1A, referring to FIG. 1C, the first opening 121 has a third width (W3) along the second direction (line segment B-B') of the substrate 102; the second opening 141 has a fourth width (W4) along the second direction (line segment B-B') of the substrate 102. According to an embodiment of the invention, the fourth width (W4) is greater than the third width (W3). According to an embodiment of the invention, a ratio (W4/W3) of the fourth width to the third width is approximately greater than 1 and less than or equal to 2.

FIG. 2 is a top view illustrating a contact window structure 200 according to an embodiment of the invention. The contact window structure 200 includes a first metal layer 210, a first insulating layer 220, a second metal layer 230 and a second insulating layer 240. Different from the contact window structure 100 in FIG. 1A, one side of a second opening 241 is in contact with the second metal layer 230 in FIG. 2. Since first metal layer 210 is in contact with the second metal layer 230 via the first opening 221, when the second metal layer 230 is further connected to other circuit components (not shown), the first metal layer 210 can be indirectly and electrically connected to other circuit components via the second metal layer 230. In one embodiment of the invention, the contact window structure 200 may further include a third metal layer (not shown). The third metal layer may cover the second insulating layer and the second opening, and may contact with the second metal layer via the second opening.

FIG. 3 is a top view illustrating a contact window structure 300 according to an embodiment of the invention. The contact window structure 300 includes a first metal layer 310, a first insulating layer 320, a second metal layer 330 and a second insulating layer 340. Different from the contact window structure 100 in FIG. 1A, two opposite side edges of a second opening 341 are in contact with the second metal layer 330 in FIG. 3. Since the first metal layer 310 is electrically connected to the second metal layer 330 via the first opening 321, when the second metal layer 330 is further connected to other circuit components (not shown), the first metal layer 310 can be electrically and indirectly connected to other circuit components via the second metal layer 330. In one embodiment of the invention, the contact window structure 300 may further include the third metal layer (not shown). The third metal layer may cover the second insulating layer and the second opening, and may contact with the second metal layer via the second opening.

FIG. 4 is a top view illustrating a contact window structure 400 according to an embodiment of the invention. The contact window structure 400 includes a first metal layer 410, a first insulating layer 420, a second metal layer 430 and a second insulating layer 440. Different from the contact window structure 100 in FIG. 1A, two adjacent side edges of the second opening 441 are in contact with the second metal layer 430 in FIG. 4. Since the first metal layer 410 is electrically connected to the second metal layer 430 via the first opening 421, when the second metal layer 430 is further connected to other circuit components (not shown), the first metal layer 410 can be electrically and indirectly connected to other circuit components via the second metal layer 430. In one embodiment of the invention, the contact window structure 400 may further include the third metal layer (not shown). The third metal layer may cover the second insulating layer and the second opening, and may contact with the second metal layer via the second opening.

FIG. 5 is a top view illustrating a contact window structure 500 according to an embodiment of the invention. The contact window structure 500 includes a first metal layer 510, a first insulating layer 520, a second metal layer 530 and a second insulating layer 540. Different from the contact window structure 100 in FIG. 1A, three side edges of the second opening 541 are in contact with the second metal layer 530 in FIG. 5. Since the first metal layer 510 is electrically connected to the second metal layer 530 via the first opening 521, when the second metal layer 530 is further connected to other circuit components (not shown), the first metal layer 510 can be indirectly and electrically connected to other circuit components via the second metal layer 530. In one embodiment of the invention, the contact window structure 500 may further include the third metal layer (not shown). The third metal layer may cover the second insulating layer and the second opening, and may contact with the second metal layer via the second opening.

Figure 6A:
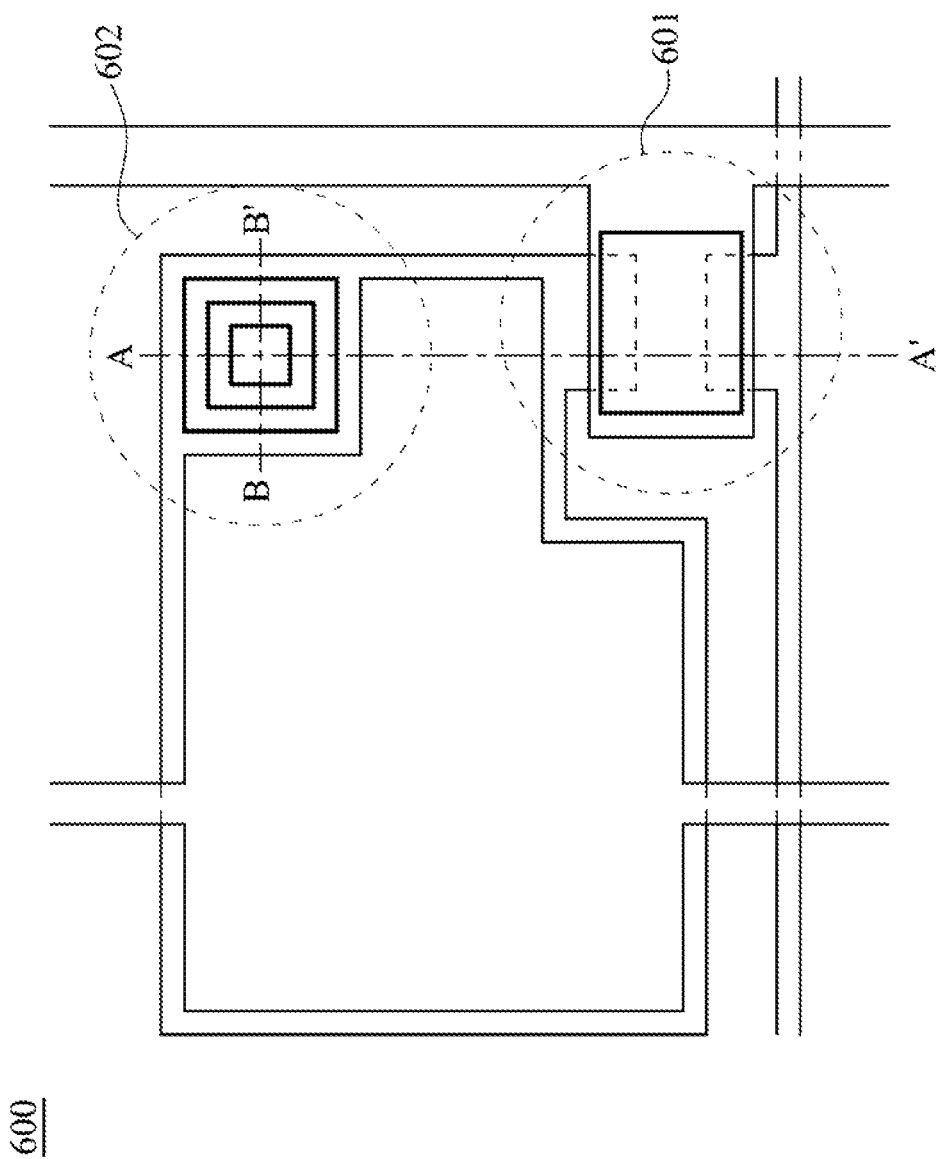
FIG. 6A is a top view illustrating a pixel structure 600 according to an embodiment of the invention.
Figure 6B:
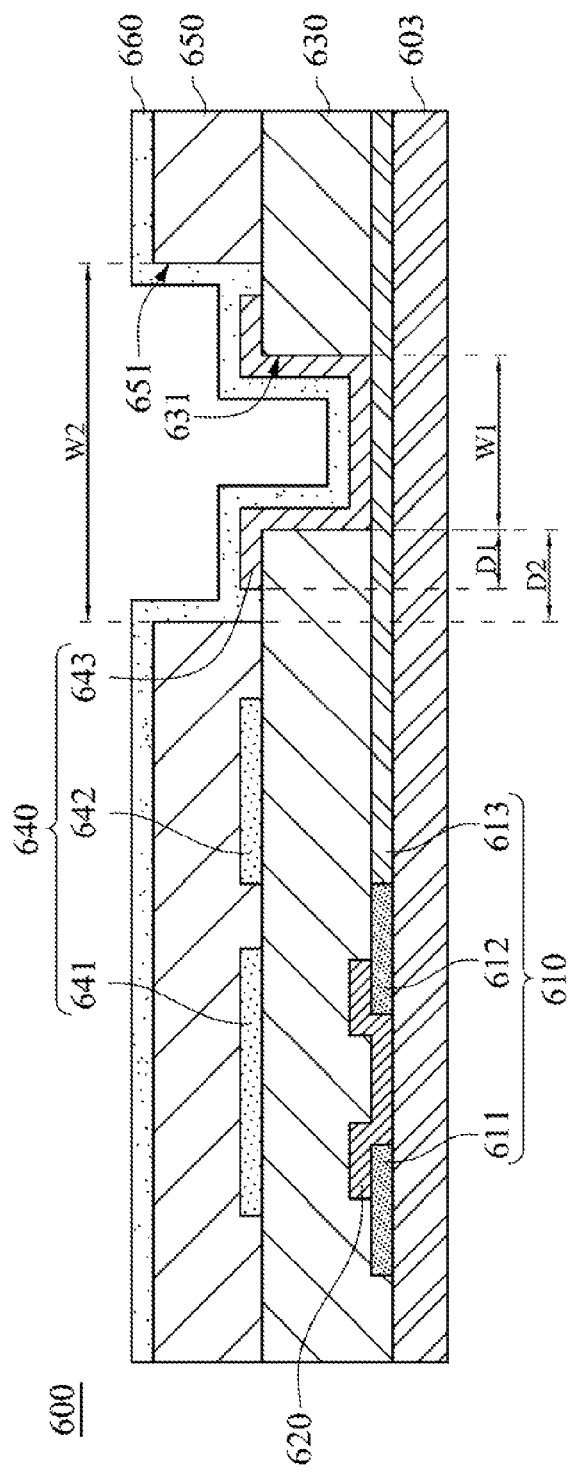
FIGS. 6B and 6C are cross-sectional views illustrating the pixel structure 600 in FIG. 6A.
Figure 6C:
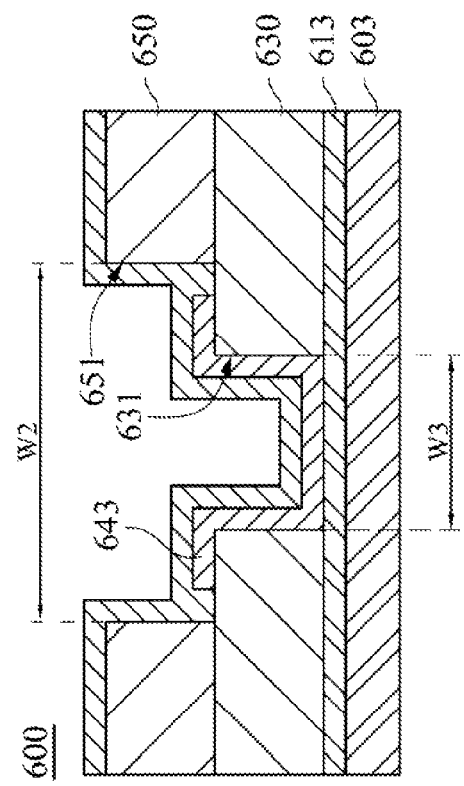

FIG. 6A is a top view illustrating a pixel structure 600 according to an embodiment of the invention. FIG. 6B is a cross-sectional view of FIG. 6A along a line segment A-A'. FIG. 6C is a cross-sectional view of FIG. 6A along a line segment B-B'.

The pixel structure 600 includes a substrate 603, a first metal layer 610, a semiconductor layer 620, a gate insulating layer 630, a second metal layer 640, a protection layer 650, and a pixel electrode 660. In FIG. 6A, the top view of the pixel structure 600 can be roughly divided into a thin-film transistor structure 601 and a contact window structure 602.

Along the line segment A-A' in FIG. 6A, referring to FIG. 6B, the first metal layer 610 is positioned on the substrate 603. The first metal layer 610 includes a source 611, a drain 612, and a first electrode 613. The semiconductor layer 620 is positioned between the source 611 and the drain 612, and is in contact with the source 611 and the drain 612. The gate insulating layer 630 covers the semiconductor layer 620 and the first metal layer 610, and the gate insulating layer 630 has a first contact window 631 exposing a part of the first electrode 613. According to an embodiment of the invention, the first contact window 631 has a first width (W1) along the first direction (line segment A-A') of the substrate 603.

The second metal layer 640 is positioned on the gate insulating layer 630, and the second metal layer 640 includes a gate 641, a second electrode 642 and a contact pad 643. The second electrode 642 and the first electrode 613 form a storage capacitor, and the contact pad 643 is in contact with the first electrode 613.

The protection layer 650 covers the gate insulating layer 630 and the second metal layer 640. The protection layer 650 has a second contact window 651 exposing the contact pad 643 and a part of the gate insulating layer 630, in which a projection area of the second contact window 651 on the substrate 603 covers a projection area of the first contact window 631 on the substrate 603 (see FIG. 6A). According to an embodiment of the invention, the second contact window 651 has a second width (W2) along the first direction (line segment A-A') of the substrate 603. According to an embodiment of the invention, the second width (W2) is greater than the first width (W1). According to an embodiment of the invention, a ratio (W2/W1) of the second width to the first width is approximately greater than 1 and less than or equal to 2.

The pixel electrode 660 covers the protection layer 650, and is formed in the second contact window 651 to contact with the contact pad 643.

In FIG. 6B, there is a first distance between a side of the contact pad 643 and an edge of the first contact window 631 at the side. There is a second distance between an edge of the second contact window 651 and the edge of the first contact window 631. The second distance (D2) is greater than the first distance (D1). According to an embodiment of the invention, a ratio (D2/D1) of the second distance to the first distance is approximately greater than 1 and less than or equal to 1.5.

Along the line segment B-B' in FIG. 6A, referring to FIG. 6C, the first contact window 631 has a third width (W3) along the second direction (line segment B-B') of the substrate 603, and the second contact window 651 has a fourth width (W4) along the second direction (line segment B-B') of the substrate 603. According to an embodiment of the invention, the fourth width (W4) is greater than the third width (W3). According to an embodiment of the invention, a ratio (W4/W3) of the fourth width to the third width is approximately greater than 1 and less than or equal to 2.

Figure 7:
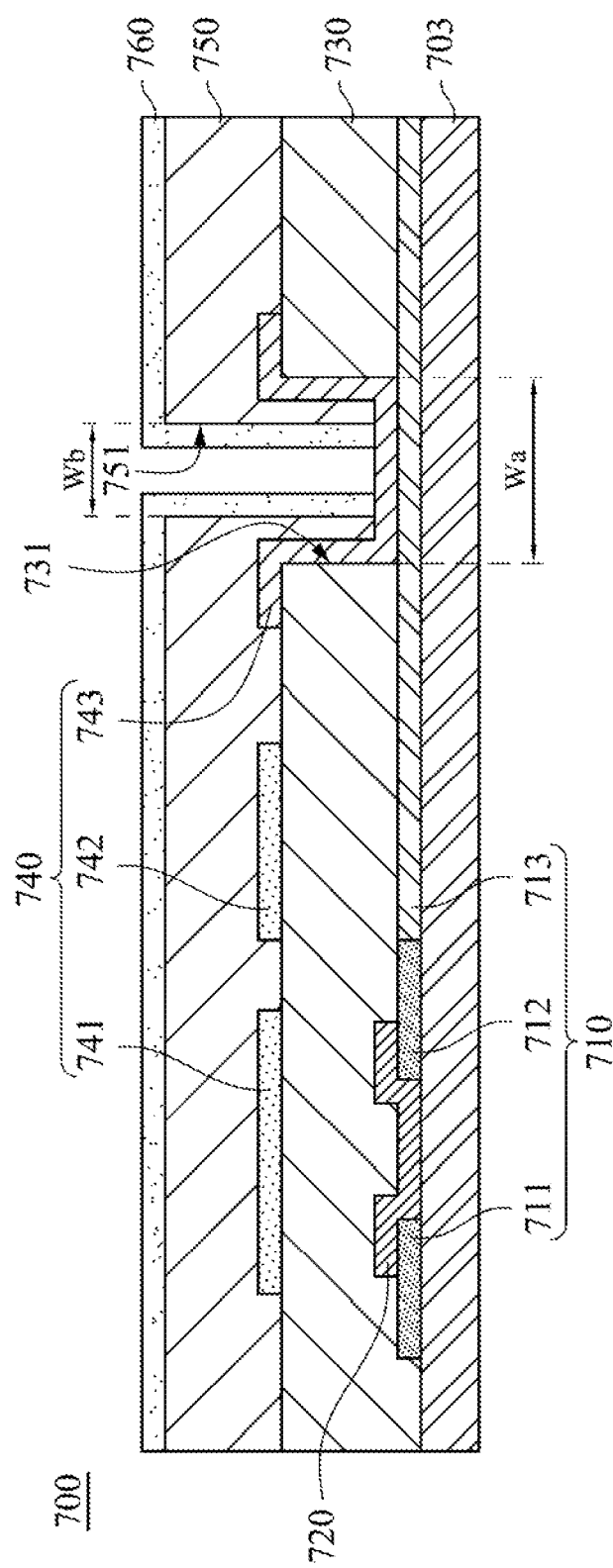
FIG. 7 is a cross-sectional view illustrating a pixel structure 700 according to a comparative example of the invention.

FIG. 7 is a cross-sectional view illustrating a pixel structure 700 according to a comparative example of the invention, in FIG. 7, the pixel structure 700 includes a substrate 703, a first metal layer 710, a semiconductor layer 720, a gate insulating layer 730, a second metal layer 740, a protection layer 750 and a pixel electrode 760.

The first metal layer 710 is positioned on the substrate 703, and the first metal layer 710 includes a source 711, a drain 712 and a first electrode 713. The semiconductor layer 720 is positioned between the source 711 and the drain 712, and is in contact with the source 711 and the drain 712. The gate insulating layer 730 covers the semiconductor layer 720 and the first metal layer 710. The gate insulating layer 730 has a first contact window 731 exposing a part of the first electrode 713. According to an embodiment of the invention, the first contact window 731 has a first width (Wa).

The second metal layer 740 is positioned on the gate insulating layer 730, and the second metal layer 740 includes a gate 741, a second electrode 742 and a contact pad 743. The second electrode 742 and the first electrode 713 form a storage capacitor, and the contact pad 743 is in contact with the first electrode 713.

The protection layer 750 covers the gate insulating layer 730 and the second metal layer 740. The protection layer 750 has a second contact window 751 exposing a part of the contact pad 743. According to an embodiment of the invention, the second contact window 751 has a second (Wb), and the second width (Wb) is less than the first width (Wa). The pixel electrode 760 covers the protection layer 750, and is formed in the second contact window 751 to contact with the contact pad 743.

In the comparative example, the second width (Wb) of the second contact window 751 is less than the first width (Wa) of the first contact window 731, and the contact pad 743 is below the second contact window 751. Since the second contact window 751 is formed by a lithograph process, the contact pad 743 under the second contact window 751 is likely to reflect light and resulting in bad developing resolutions, which may cause a problem of the second width (Wb) of the second contact window 751 being too narrow or failing to form an opening.

Therefore, in the embodiments of the invention, the second contact window of the protection layer exposes the contact pad and a part of the gate insulating layer, and a projection area of the second contact window on the substrate covers a projection area of the first contact window on the substrate. The first contact window has the first width along the first direction of the substrate or the first metal layer; and the second contact window has the second width along the first direction of the substrate or the first metal layer, in which the second width is greater than the first width. Since the second contact window covers a part of the gate insulating layer and light penetrates the gate insulating layer, the problem of bad developing resolutions due to the light rejection is avoid to improve resolutions of the lithograph process.

FIGS. 8A to 8I are cross-sectional views illustrating manufacturing steps of a pixel structure 800 according to an embodiment of the invention.

In FIG. 8A, a substrate 803 is provided, and a first metal layer 810 is formed on the substrate 803. The first metal layer 810 includes a source 811, a drain 812, and a first electrode 813. Then, referring to FIG. 8B, a semiconductor layer 820 is formed between the source 811 and the drain 812, and is in contact with the source 811 and the drain 812.

Figure 8D:
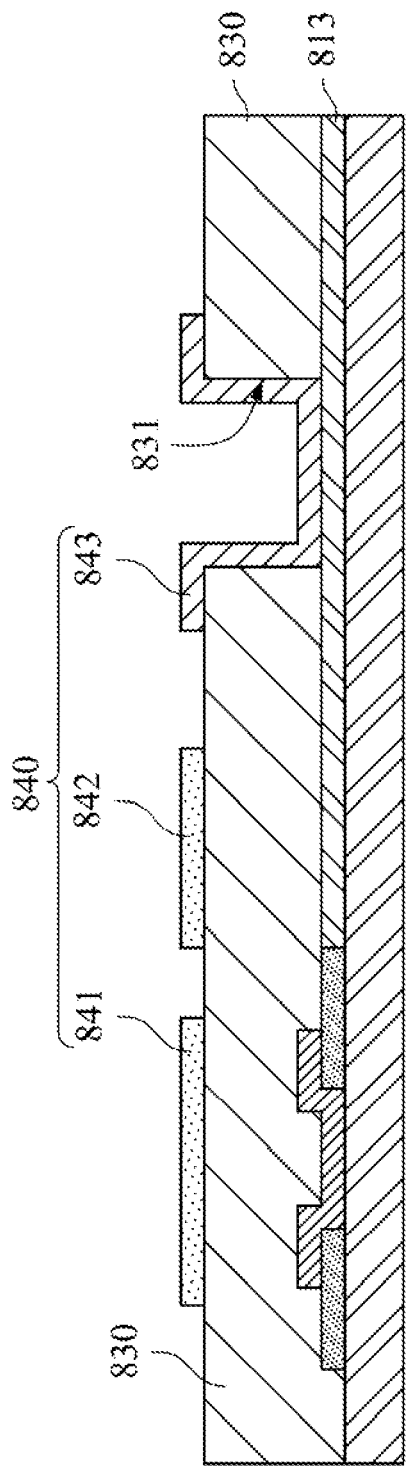

In FIG. 8C, a gate insulating layer 830 is formed on the semiconductor layer 820, the first metal layer 810 and the substrate 803. The gate insulating layer 830 has a first contact window 831 to expose a part of the first electrode 813. According to an embodiment of the invention, the first contact window 831 has a first width (W1). Then, as shown in FIG. 8D, a second metal layer 840 is formed on the gate insulating layer 830. The second metal layer 840 includes a gate 841, a second electrode 842 and a contact pad 843. The second electrode 842 and the first electrode 813 form a storage capacitor, and the contact pad 843 is in contact with the first electrode 813 in the first contact window 831.

Figure 8E:
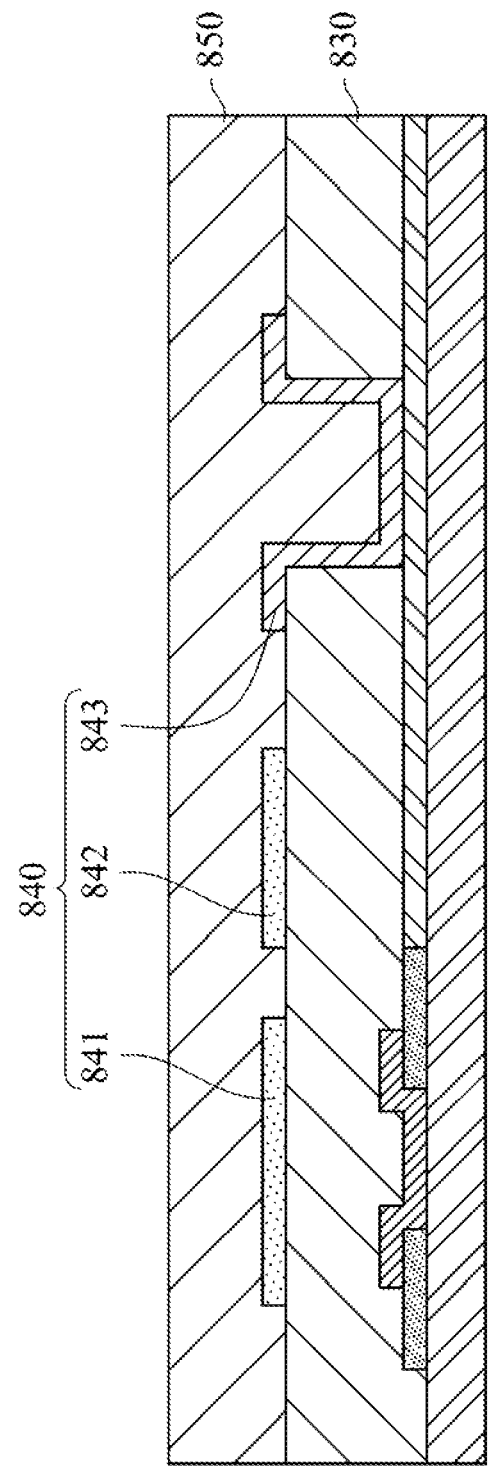

In FIG. 8E, a protection layer 850 is formed on the second metal layer 840 and the gate insulating layer 830. Next, a lithograph process is performed, such that the protection layer 850 forms a second contact window 851 exposing the contact pad 843 and a part of the gate insulating layer 830, as shown in FIG. 8H. A projection area of the second contact window 851 on the substrate 803 covers a projection area of the first contact window 831 on the substrate 803. According to an embodiment of the invention, the first contact window 831 has a first width (W1), and the second contact window 851 has a second width (W2). According to an embodiment of the invention, the second width (W2) is greater than the first width (W1). According to an embodiment of the invention, a ratio (W2/W1) of the second width to the first width is approximately greater than 1 and less than or equal to 2. According to an embodiment of the invention, there is a first distance between a side of the contact pad 843 and an edge of the first contact window 831 at the same side, and there is a second distance between an edge of the second contact window 851 and the edge of the first contact window 831. The second distance (D2) is greater than the first distance (D1). According to an embodiment of the invention, a ratio (D2/D1) of the second distance to the first distance is approximately greater than 1 and less than or equal to 1.5. In FIG. 8I, a pixel electrode 860 is formed to cover the protection layer 850, and is formed in the second contact window 851 to contact with the contact pad 843.

Figure 8F:
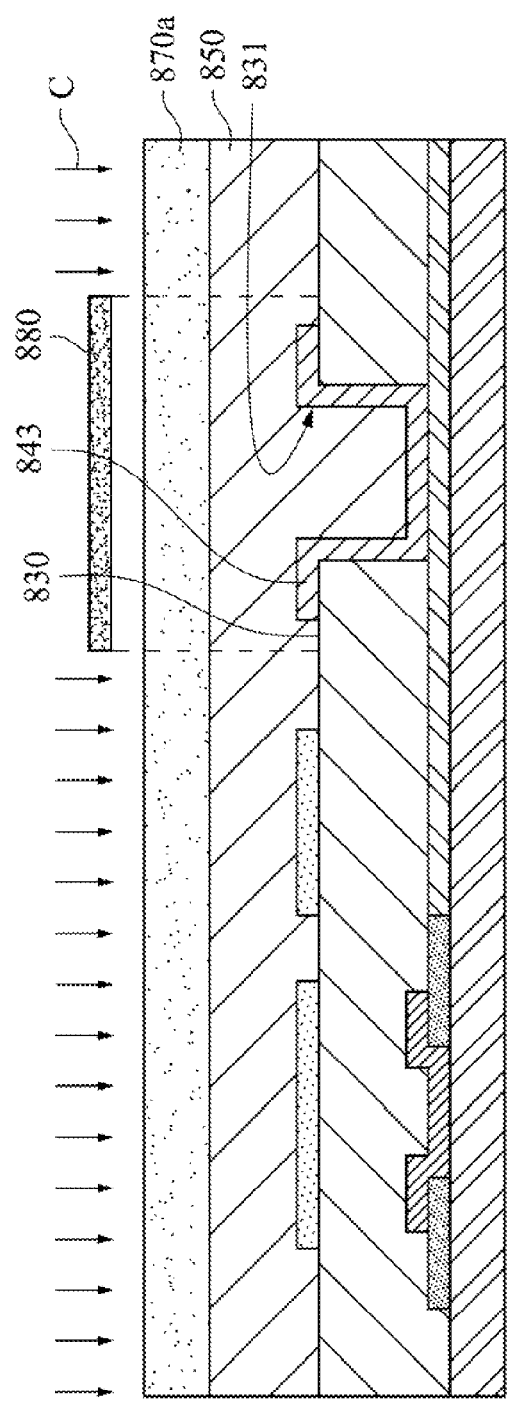
Figure 8G:
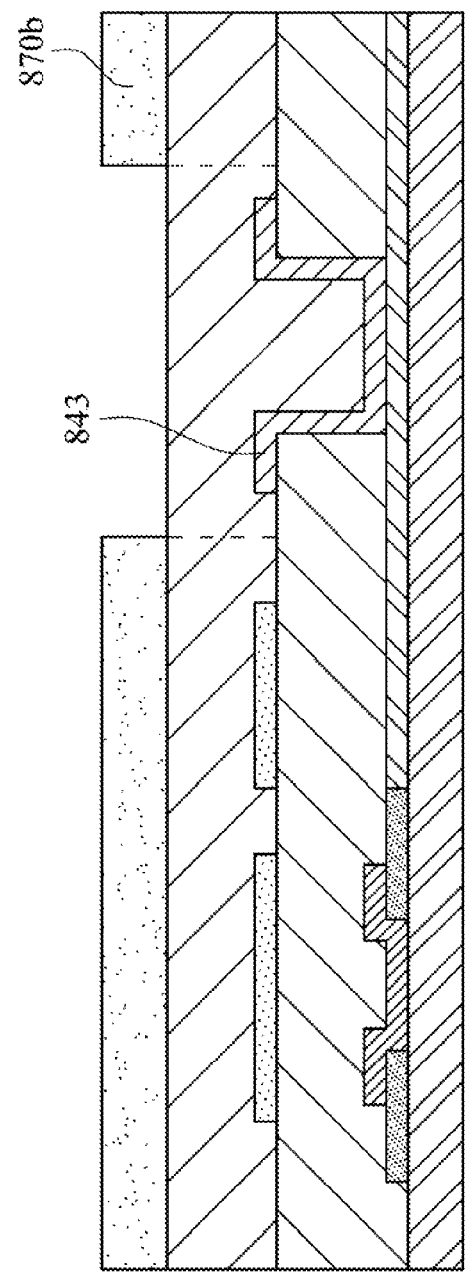

The lithograph process in FIG. 8H further includes steps in FIGS. 8F to 8G. In FIG. 8F, a photoresist layer 870a is formed on the protection layer 850. The first contact window 831 is covered with a mask 880, and a projection area of the mask 880 on the gate insulating layer 830 covers a part of the gate insulating layer 830 and the contact pad 843. When the photoresist layer 870a is developed by light C, the light is not reflected by the contact pad 843 due to the projection area contact pad 843 of the mask 880 on the gate insulating layer 830 and thus a developing resolution is not decreased.

Then, as shown in FIG. 8G, the photoresist layer 870a is developed (see FIG. 8F) to form a patterned photoresist layer 870b. In FIG. 8G, since a width of an opening of the patterned photoresist layer 870b is greater than the contact pad 843, after forming the second contact window 851, the second contact window 851 exposes a part of the gate insulating layer 830 (see FIG. 8H).

In the embodiments of the invention, the contact window structure includes a first metal layer, a first insulating layer, a second metal layer, a second insulating layer and a third metal layer. The contact window structure provided in the embodiments of the invention can overcome the problem of bad developing resolutions in lithograph processes, so as to increase the developing resolution and cause the contact window having an expected aperture.

On the other hand, in the pixel structure provided in the embodiments of the invention, the second contact window exposes the contact pad and a part of the gate insulating layer, and a projection area of the second contact window on the substrate covers a projection area of the first contact window on the substrate. In other words, the width of the second contact window is greater than the width of the first contact window. Since the second contact window covers a part of the gate insulating layer and light penetrates the gate insulating layer, the problem of bad developing resolutions due to the light reflection is avoid, and thus the resolution of the lithograph process is improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A contact window structure comprising:
a first metal layer positioned on a substrate;
a first insulating layer positioned on the first metal layer, wherein the first insulating layer has a first opening, and the first opening exposes a part of the first metal layer;
a second metal layer covering the first opening and in contact with the first metal layer via the first opening;
a second insulating layer positioned on the first insulating layer, wherein the second insulating layer has a second opening, the second opening exposes the second metal layer and a part of the first insulating layer, and a projection area of the second opening on the first metal layer covers a projection area of the first opening on the first metal layer, and any side edge of the second opening is in contact with the second metal layer; and
a third metal layer covering the second insulating layer and the second opening, and in contact with the second metal layer via the second opening.

2. The contact window structure of claim 1, wherein any three side edges of the second opening are in contact with the second metal layer.

3. The contact window structure of claim 1, further comprising an upper gate transistor structure electrically connected to the first metal layer.

4. The contact window structure of claim 1, further comprising a lower gate transistor structure electrically connected to the first metal layer.

5. The contact window structure of claim 1, wherein the first opening has a first width and the second opening has a second width along a first direction of the substrate, and the second width is greater than the first width.

6. The contact window structure of claim 5, wherein a ratio of the second width to the first width is greater than 1 and less than or equal to 2.

7. The contact window structure of claim 1 wherein the first opening has a third width and the second opening has a fourth width along a second direction of the substrate, and the fourth width is greater than the third width.

8. The contact window structure of claim 7, wherein a ratio of the fourth width to the third width is greater than 1 and less than or equal to 2.

9. The contact window structure of claim 1, wherein a first distance between a side of the second metal layer and an edge of the first opening at the side is not greater than a second distance between an edge of the second opening at the side of the second metal layer and the edge of the first opening.

10. The contact window structure of claim 9, wherein a ratio of the second distance to the first distance is greater than 1 and less than or equal to 1.5.

11. The contact window structure of claim 1, wherein any two side edges of the second opening are in contact with the second metal layer.

12. The contact window structure of claim 11, wherein the any two side edges of the second opening are two adjacent side edges or two opposite side edges.

13. A pixel structure comprising:
a substrate;
a first metal layer positioned on the substrate, wherein the first metal layer comprises:
a source;
a drain; and
a first electrode;

a semiconductor layer positioned between the source and the drain, and in contact with the source and the drain;
a gate insulating layer covering the semiconductor layer and the first metal layer, wherein the gate insulating layer has a first contact window, and the first contact window exposes a part of the first electrode;
a second metal layer positioned on the gate insulating layer, wherein the second metal layer comprises:
a gate;
a second electrode, forming a storage capacitor with the first electrode; and
a contact pad in contact with the first electrode;
a protection layer covering the gate insulating layer and the second metal layer, wherein the protection layer has a second contact window, the second contact window exposes the contact pad and a part of the gate insulating layer, and a projection area of the second contact window on the substrate covers a projection area of the first contact window on the substrate; and
a pixel electrode covering the protection layer and formed in the second contact window to contact with the contact pad.

14. The pixel structure of claim 13, wherein the first contact window has a first width and the second contact window has a second width along a first direction of the substrate, and the second width is greater than the first width.

15. The pixel structure of claim 14, wherein a ratio of the second width to the first width is greater than 1 and less than or equal to 2.

16. The pixel structure of claim 13, wherein the first contact window has a third width and the second contact window has a fourth width along a second direction of the substrate, and the fourth width is greater than the third width.

17. The pixel structure of claim 16, wherein a ratio of the fourth width to the third width is greater than 1 and less than or equal to 2.

18. A method for manufacturing a pixel structure, the method comprising:
providing a substrate;
forming a first metal layer on the substrate, wherein the first metal layer comprises a source, a drain and a first electrode;
forming a semiconductor layer between the source and the drain, wherein the semiconductor layer is in contact with the source and the drain;
forming a gate insulating layer on the semiconductor layer, the first metal layer and the substrate, wherein the gate insulating layer has a first contact window to expose a part of the first electrode;
forming a second metal layer on the gate insulating layer, wherein the second metal layer comprises a gate, a second electrode and a contact pad, wherein the second electrode and the first electrode form a storage capacitor, and the contact pad is in contact with the first electrode in the first contact window;
forming a protection layer on the second metal layer and the gate insulating layer;
performing a lithography process such that the protection layer forms a second contact window, and the second contact window exposes the contact pad and a part of the gate insulating layer, wherein a projection area of the second contact window on the substrate covers a projection area of the first contact window on the substrate; and
forming a pixel electrode covering the protection layer, and forming the pixel electrode in the second contact window to contact with the contact pad.

19. The method of claim 18, wherein the lithography process comprises:
forming a photoresist layer on the protection layer;
covering the first contact window with a mask, wherein a projection area of the mask on the gate insulating layer covers a part of the gate insulating layer and a part of the contact pad;
developing the photoresist layer to form a patterned photoresist layer; and
etching the protection layer to form he second contact window.

* * * * *